United States Patent [19]
Kobayashi

[11] Patent Number: 5,710,523
[45] Date of Patent: Jan. 20, 1998

[54] LOW NOISE-LOW DISTORTION HEMT LOW NOISE AMPLIFIER (LNA) WITH MONOLITHIC TUNABLE HBT ACTIVE FEEDBACK

[75] Inventor: Kevin W. Kobayashi, Torrance, Calif.

[73] Assignee: TRW Inc., Redondo Beach, Calif.

[21] Appl. No.: 586,410

[22] Filed: Jan. 16, 1996

[51] Int. Cl.$^6$ .................................................. H03F 1/34
[52] U.S. Cl. ............................................ 330/293; 330/300
[58] Field of Search ............................ 330/85, 282, 285, 330/286, 293, 300

[56] References Cited

U.S. PATENT DOCUMENTS

| | | | |
|---|---|---|---|
| 4,608,542 | 8/1986 | Siegel | 330/282 X |
| 5,051,372 | 9/1991 | Sasaki | 437/5 |
| 5,264,806 | 11/1993 | Kobayashi | 330/294 |
| 5,312,765 | 5/1994 | Kanber | 437/22 |
| 5,355,096 | 10/1994 | Kobayashi | 330/278 |

OTHER PUBLICATIONS

Song et al., "Self-Aligned InAlAs/InGaAs Heterojunction Bipolar Transistor With a Buried Subcollector Grown by Selective Epitaxy", *IEEE Election Device Letters*, vol. 15, No. 4, Apr. 1994, pp. 123–125.

Streit et al., "A Monolithic HBT–Regulated HEMT LNA by Selective MBE," *IEEE Microwave and Guided Wave Letters*, vol. 5, No. 4, Apr. 1995, pp. 124–126.

Kobayashi et al., "A Novel Heterojunction Bipolar Transistor Active Feedback Design," *IEEE Microwave and Guided Wave Letters*, vol. 4, No. 5, May 1994, pp. 146–148.

Chu et al., "A Highly Linear MESFET," *1991 MTT Symp. Dig.*, Boston, MA.

Struble et al., "Modelling Intermodulation Distortion in GaAs MESFETs Using Pulsed I-V Characteristics," *1991 IEEE GaAs IC Symp. Dig.*, Monterey, CA, pp. 179–182.

Chu et al., "High Linearity Monolithic Broadband Pseudomorphic Spike-Doped MESFET Amplifiers," *1992 IEEE GaAs IC Symp. Dig.*, Miami, FL, pp. 211–214.

H. Seidel, "A Feedforward Experiment Applied to an L–4 Carrier System Amplifier," *IEEE Trans. on Communication Technology*, vol. COM–19, No. 3, Jun. 1971, pp. 320–325.

Katz et al., "Passive FET MMIC Linearizers for C, X and Ku–Band Satellite Applications," *1993 IEEE MMWMC Symp. Dig.*, Atlanta, GA, pp. 155–158.

Katz et al., "A Reflective Diode Linearizer for Spacecraft Applications," *1985 IEEE MTT Symp. Dig.*, St. Louis, Missouri, pp. 661–664.

Inada et al., "A Compact 4–GHz Linearizer for Space Use," *IEEE Trans. on MTT*, vol. MTT–34, No. 12, Dec. 1986, pp. 1327–1986.

Muraguchi et al., "A Linear Limiter: A 11 GHz Monolithic Low Distortion Variable Gain Amplifier," *1991 IEEE MTT Symp. Dig.*, Boston, MA, pp. 525–528.

Nishikawa et al., "An MMIC Low–Distortion Variable–Gain Amplifier Using Active Feedback," *1995 IEEE MTT Symp. Dig.*, Orlando, FL, pp. 1619–1622.

Pedro et al., "An MMIC Linearized Amplifier Using Active Feedback," *1993 IEEE MMWMC Symp. Dig.*, Atlanta, GA, pp. 113–116.

Streit et al, "Monolithic HEMT–HBT Integration by Selective MBE," *IEEE Trans. on Electron Devices*, vol. 42, No. 4, Apr. 1995, pp. 618–623.

*Primary Examiner*—Steven Mottola
*Attorney, Agent, or Firm*—Michael S. Yatsko

[57] ABSTRACT

A low noise amplifier (LNA), formed as a monolithic microwave integrated circuit (MMIC), includes a high-electron mobility transistor (HEMT) and utilizes tunable heterojunction bipolar transistor (HBT) active feedback to improve the amplifier's gain-bandwidth and linearity performance and to provide for self-biasing of the HEMT. In addition to enhancing the self-biasing, the MMIC, in accordance with the present invention, allows the frequency bandwidth and linearity characteristics of the LNA to be adjusted after the MMIC LNA has been fabricated without significantly degrading the noise figure performance.

9 Claims, 7 Drawing Sheets

LOW NOISE-LOW DISTORTION HEMT LOW NOISE AMPLIFIER (LNA) WITH MONOLITHIC TUNABLE HBT ACTIVE FEEDBACK

BACKGROUND OF THE INVENTION

1. Field of the Invention

The present invention relates to a high linearity-low noise amplifier (LNA) formed as a two-port microwave monolithic integrated circuit (MMIC) and more particularly to a monolithic high-electron mobility transistor (HEMT) high linearity LNA with monolithically integrated tunable heterojunction bipolar transistor (HBT) active feedback which provides for self-biasing of the HEMT and enables the gain, bandwidth, and linearity characteristics of the LNA to be adjusted after the MMIC is fabricated without significantly degrading the noise figure performance of the LNA.

2. Description of the Prior Art

A low noise amplifier (LNA) with a relatively high linearity is required in microwave receivers for known wireless and cellular commercial applications. For low noise applications, high-electron mobility transistors (HEMTs) are known to provide superior noise figure performance relative to other known technologies. Unfortunately, the threshold voltage of such HEMTs is relatively sensitive and is known to vary as a function of the device profile as well as the process technology for fabricating the HEMT, as discussed in "A MONOLITHIC HBT-REGULATED HEMT LNA BY SELECTIVE MBE", by Dwight C. Streit, Kevin W. Kobayashi, Aaron K. Oki and Donald K. Umemoto, *IEEE Microwave and Guided Wave Letters*, Vol. 5, No. 4, April 1995, pp. 124–126, hereby incorporated by reference. In particular, subtle wafer-to-wafer variations in the HEMT material profile, as well as the gate process, can result in a wafer-to-wafer variation in the threshold voltage. The threshold voltage is even known to vary between adjacent devices on the same wafer. As such, the use of such HEMT LNAs requires regulation of the biasing current.

Various off-chip and monolithically integrated regulators are known to compensate for such variations. For example, a monolithic HEMT regulated circuit, integrated with an HEMT LNA, is disclosed in "A Monolithic HEMT Regulated Self-Biased LNA", by K. W. Kobayashi, R. Esfandiari, B. Nelson, K. Minot, W. Jones, M. Bidenbender, R. Lai, K. L. Tan and J. Berenz, *Proc, IEEE 1994 Microwave and Millimeter Wave Monolithic Circuits Symposium*, 1994, pp. 121–124, hereby incorporated by reference. While the monolithic HEMT LNA with an integrated HEMT regulator improves bias regulation, the device is still sensitive to on-wafer threshold variations.

In addition to the HEMT LNA MMICs being difficult to self-bias, such MMICs have relatively limited linearity performance. Several techniques are known for improving the amplifier linearity performance. Such techniques include feed-forward linearization and pre-distortion techniques as discussed in detail in: "A Feedforward Experiment Applied to an L-4 Carrier System Amplifier", by H. Seidel, *IEEE Trans. on Communication Technology*, Vol. COM-19, No. 3, pp. 320–325, June 1971; "Passive FET MMIC Linearizers for C, X and Ku-Band Satellite Applications", by A. Katz, S. Moochalla and J. Klatsicin, 1993 *IEEE MMWMC Symposium Digest*, Atlanta, Ga., pp. 155–158; "A Reflective Diode Linearized for Spacecraft Applications", by A. Katz, R. Sudarsanam and D. Aubert, 1985 *IEEE MTT Symposium Digest*, St. Louis, Mo., pp. 661–664; and "A Compact Linearizer for Space Use", by R. Inada, H. Ogawa, S. Kitazume and P. Desantis, *IEEE Transactions on MTT*, Vol. MTT-34, pp. 1327–1986, December 1986; all hereby incorporated by reference. These techniques are known to involve relatively complicated systems which require additional hardware, such as couplers, amplifiers, phase shifters, and the like, which consume a relatively large area on the MMIC and are not known to be economically feasible for high-volume commercial production of an MMIC. Moreover, such techniques are normally employed for improving the linearity of power amplifiers would thus have a detrimental effect on the noise performance of an LNA.

Active and passive field effect transistor (FET) feedback networks are also known to be used for improving the intermodulation distortion (IMD) performance of amplifiers. Examples of such networks are disclosed in detail in: "A Linear Limiter: An 11 GHz Monolithic Low Distortion Variable Gain Amplifier", by M. Muraguchi and M. Aikawa, 1991 *IEEE MTT Symposium Digest*, Boston, Mass., pp. 525–528; "An MMIC Low-Distortion Variable-Gain Amplifier Using Active Feedback", by K. Nishikawa and T. Tokumitsu, 1995 *IEEE MTT Symposium Digest*, Orlando, Fla., pp. 1619–1622; and "An MMIC Linearized Amplifier Using Active Feedback", by J. C. Pedro and J. Perez, 1993 *IEEE MMWMC Symposium Digest*, Atlanta, Ga., pp. 113–116; all hereby incorporated by reference. Although such techniques improve the IMD performance under large signal compressed conditions, such techniques do not lend themselves to good noise figure performance.

Another problem with known HEMT LNA MMICs is that the gain and bandwidth performance of such devices is sensitive to process variations and are non-adjustable after the semiconductor fabrication and packaging is complete.

SUMMARY OF THE INVENTION

It is an object of the present invention to provide an HEMT LNA MMIC which solves the problems in the prior art.

It is yet another object of the present invention to provide an HEMT LNA MMIC which includes a monolithically integrated circuit for regulating the bias current to account for variations in the threshold voltage of HEMT devices.

It is yet another object of the present invention to provide an HEMT LNA with improved linearity performance.

It is yet a further object of the present invention to provide an HEMT LNA MMIC which enables the gain, bandwidth and linearity performance of the device to be electronically adjusted after the MMIC is fabricated without degrading the noise figure performance.

Briefly, the present invention relates to a low noise amplifier (LNA) formed as a monolithic microwave integrated circuit (MMIC). The LNA includes a high-electron mobility transistor (HEMT) and utilizes heterojunction bipolar transistor (HBT) active feedback for self-biasing of the HEMT. In addition to enhancing the self-biasing, the MMIC in accordance with the present invention allows the gain, frequency bandwidth, and linearity characteristics of the LNA to be adjusted without significantly degrading the noise figure performance of the LNA.

BRIEF DESCRIPTION OF THE DRAWING

These and other objects of the present invention will be readily understood upon reference to the following specification and attached drawing, wherein.

DETAILED DESCRIPTION OF THE INVENTION

Figure 1A:
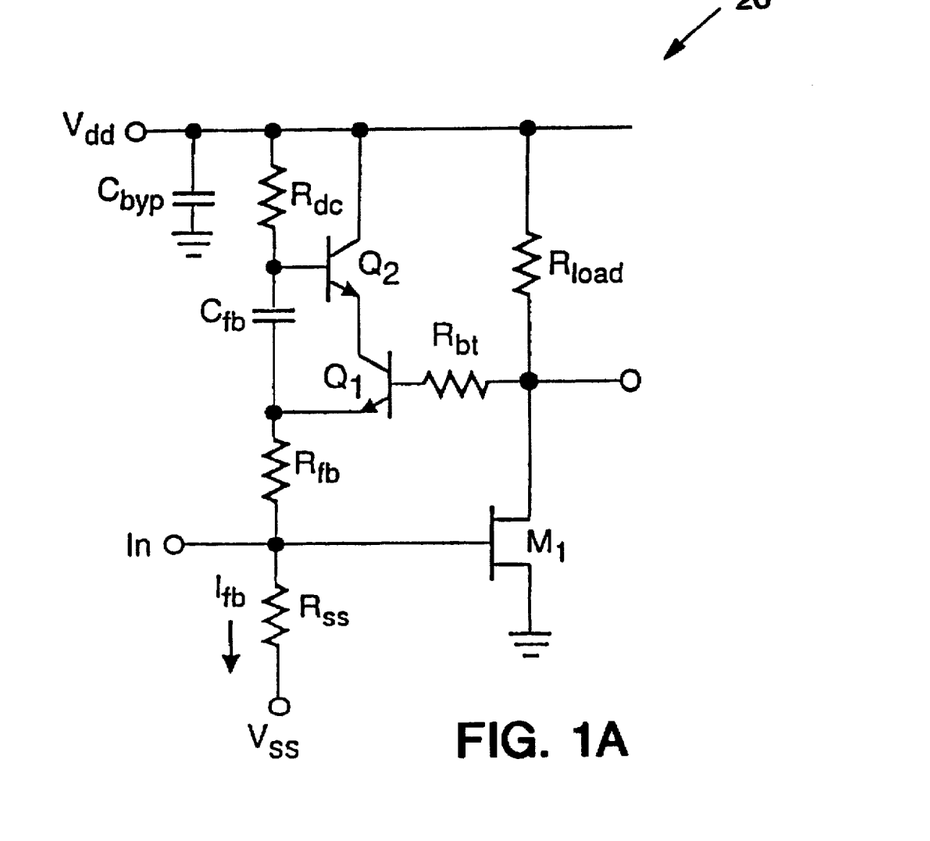
FIG. 1A is a schematic diagram of an HEMT low noise amplifier with HBT active feedback in accordance with the present invention.
Figure 1B:
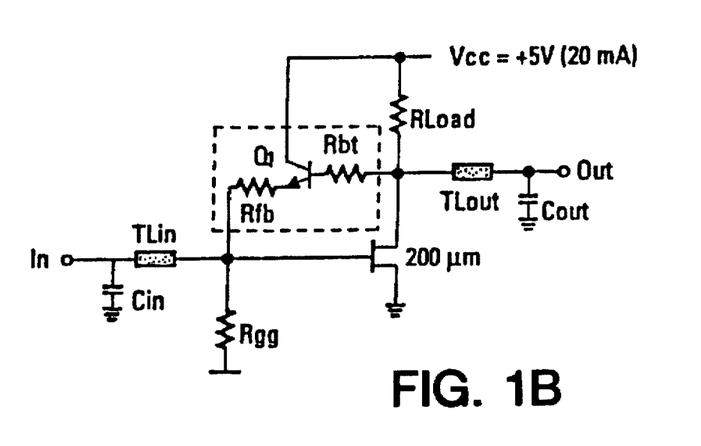
FIG. 1B is an alternate embodiment of the low noise amplifier illustrated in FIG. 1A.

FIGS. 1A and 1B illustrate two embodiments of a high-electron mobility transistor (HEMT) low noise amplifier (LNA) in accordance with the present invention which includes monolithically integrated heterojunction bipolar transistor (HBT) active feedback forming a monolithic microwave integrated circuit (MMIC). The HBT active feedback, in addition to providing for self-biasing of the HEMT, is adjustable, which enables the gain-bandwidth of the HEMT LNA to be electronically adjusted while improving the linearity performance without significantly degrading the noise figure performance. As will be discussed in more detail below, by increasing the HBT feedback to the HEMT by way of adjustment of the bias of the HBT, the gain-bandwidth of the device can be increased from about 11 to 16 gigahertz. Tuning of the HBT feedback also improves the linearity, and in particular the IP3 performance, from less than 20 dBm to >24 dBm across a 1–11 gigahertz band with a peak IP3 of 30 dBm. Relative to known HEMT amplifiers with resistive feedback only, the HEMT LNA with HBT feedback provides about a 50 percent improvement in the gain-bandwidth, as well as a 6–10 improvement in the IP3 without significantly increasing the chip size or DC power consumption. In particular, the use of HBT or bipolar transistors for the active feedback offers several advantages over FET and HEMT feedback devices. For example, the HBT/bipolar devices are relatively easier to self-bias, offer lower DC current and power consumption, and can be implemented in a relatively smaller area and do not require DC blocking capacitors as discussed in detail in: "A Novel Active Feedback Design Using InAlAs/InGaAs Heterojunction Bipolar Transistors", by K. W. Kobayashi, L. T. Tran, J. R. Velebir, A. K. Oki and D. C. Streit, *IEEE Microwave and Guided Wave Letters*, Vol. 4, No. 5, pp. 146–148, May 1994, hereby incorporated by reference.

Two embodiments of the HEMT LNA, in accordance with the present invention, are disclosed. In the first embodiment, illustrated in FIG. 1A, two HBTs, connected in cascode, are used to provide active feedback for the HEMT. In a second embodiment, illustrated in FIG. 1B, a single HBT is used for active feedback. Both embodiments rely upon the monolithic integration of an HEMT and an HBT, using selective molecular beam epitaxy (MBE) and a merged HEMT-HBT process as described in detail in "Monolithic HEMT-HBT Integration by Selective MBE", by D. C. Streit, D. K. Umemoto, K. W. Kobayashi and A. K. Oki, *IEEE Transactions on Electron Devices*, Vol. 42, No. 4, April 1995, pp. 618–623; and "A Monolithic HBT-regulated HEMT LNA by Selective MBE", by Dwight C. Streit, Kevin W. Kobayashi, Aaron K. Oki and Donald K. Umemoto, *IEEE Microwave and Guided Wave Letters*, Vol. 5, No. 4, April 1995, pp. 124–126, hereby incorporated by reference. The process integrates a 0.2 μM gate-length pseudomorphic InGaAs-GaAs HEMTs with 2 μM emitter-width GaAs-AlGaAs HBTs. The HEMT devices achieve a maximum gain $G_M$>500 mS/mm with a gain-bandwidth product $f_T$ greater than 60 gigahertz (GHz). The HBT devices achieve a gain β=60 with gain-bandwidth product $f_T$ and a maximum frequency $f_{MAX}$ of 23 GHz and 50 GHz, respectively, with a current density $J_c$=20 kA/cm².

In one embodiment of the invention as illustrated in FIG. 1A, which incorporates an HEMT $M_1$ and two HBTs, $Q_1$ and $Q_2$, connected in cascode, the HEMT-HBT LNA MMIC may be configured as a 0.2 μm×200 μm HEMT device, biased to approximately 20–25 mA. The HBT devices $Q_1$ and $Q_2$ may be configured by 2×10 μm² four-finger emitter HBTs with a variable collector bias current ($I_{fc}$) between approximately 0–5 mA. The primary supply voltage $V_{dd}$ may be about 5 volts DC, consuming between about 20.4–24 mA. The tunable secondary supply voltage $V_{ss}$ may be varied from 0 to −5 volts DC, consuming about 0.5–3.6 mA. The MMIC, in accordance with the present invention, may be configured to be as small as 300 μ×300 μ without bond pads and transmission lines.

Referring to FIG. 1A, an HEMT LNA in accordance with the present invention, generally identified with the reference numeral 20, includes an HEMT device $M_1$, which provides the low-noise performance for the amplifier. A load resistance, $R_{load}$, is connected between the drain of the HEMT $M_1$ and the supply voltage $V_{dd}$ to provide a load at the drain of the HEMT $M_1$, as well as generate a quiescent DC bias of the HEMT $M_1$ through the DC supply voltage $V_{dd}$. A bypass capacitor $C_{BYP}$ may be connected between the supply voltage $V_{dd}$ and ground in order to suppress high-frequency noise in the power supply voltage $V_{dd}$. The bypass capacitor $C_{BYP}$ may be integrated on the microwave monolithic integrated circuit (MMIC).

In accordance with an important aspect of the invention, a tunable active feedback network is formed from a pair of cascode-connected HBTs, $Q_1$ and $Q_2$. The active feedback network also includes a regenerative feedback tuning resistor $R_{br}$, connected between the drain of the HEMT and the base of the HBT $Q_1$, and a feedback resistor $R_{fb}$, connected between the emitter of the HBT $Q_1$ and the gate of the HEMT $M_1$. The active feedback network also includes a DC bias resistor $R_{dc}$ connected between the base of the HBT $Q_1$ and the supply voltage $V_{dd}$, as well as a feedback capacitor $C_{fb}$, connected between the base of the HBT $Q_2$ and the emitter of the HBT $Q_1$. The feedback resistor $R_{fb}$ provides a nominal amount of resistive feedback, which is enhanced by the active feedback formed from the two HBTs in cascode. The regenerative feedback tuning resistor Rot, connected between the base of the HBT $Q_1$ and the drain of the HEMT $M_1$, may be selected to provide regenerative feedback from the HBT feedback network.

An important aspect of the invention is the ability to vary the feedback current $I_{fb}$ of the HEMT $M_1$, as well as electronic tunability of the gain-feedback external to the MMIC. In particular, a bias resistor $R_{ss}$ is connected between the gate of the HEMT $M_1$ and a second supply voltage $V_{ss}$. The second supply voltage $V_{ss}$ may be varied, for example between −1 and −5 volts DC to provide self-biasing of the HEMT $M_1$ by way of bias resistor $R_{ss}$, the feedback resistor $R_{fb}$, the feedback tuning resistor $R_{bt}$, the load resistor $R_{load}$, as well as the HBT $Q_1$. Such a configuration provides a method for tuning the HBT active feedback circuit by adjusting the secondary supply voltage $V_{ss}$. An important aspect of the invention relates to the fact that the secondary supply voltage can be adjusted externally relative to the MMIC. Change in the secondary supply voltage $V_{ss}$ results in changes of the quiescent bias current $I_{fb}$ of the HBT active feedback network. By adjusting the magnitude of the secondary supply voltage $V_{ss}$, various degrees of feedback can be induced in the system, resulting in a change in the phase and amplitude characteristics of the active feedback network.

An alternate embodiment of the invention is shown in FIG. 1B, which illustrates the use of a single HBT for the active feedback. The embodiment illustrated in FIGS. 1A and 1B is described in detail in "A Novel Monolithic HBT-P-I-N-HEMT Integrated Circuit with HBT Active Feedback and P-I-N Diode Variable Gain Control" by Kevin W. Kobayashi, Dwight C. Streit, Donald K. Umemoto and Aaron K. Oki, *IEEE Transactions on Microwave Theory and Techniques*, Vol. 43, No. 5, May 1995, pp. 1004–1009, hereby incorporated by reference.

Figure 2:
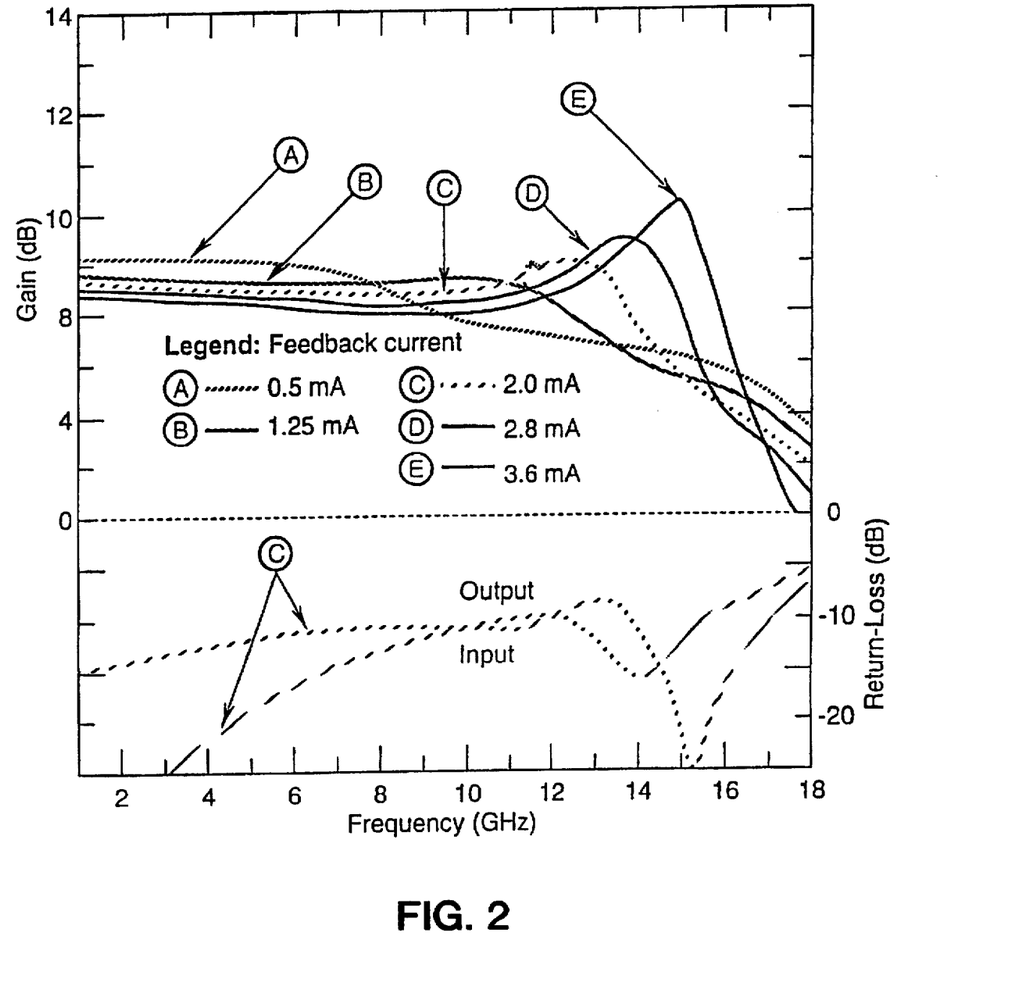
FIG. 2 is a graphical illustration of the gain and return loss of the HEMT amplifier, in accordance with the present invention, as a function of frequency for various active feedback bias currents.

FIG. 2 is a graphical illustration of the gain response of the MMIC 20 in accordance with the present invention for different active feedback bias currents $I_{fb}$. FIG. 2 also illustrates a typical input and output return-loss response at a maximum flat gain response; feedback bias current $I_{fb}$=2 mA. As shown in FIG. 2, the nominal gain is about 9 dB, with 3-dB bandwidths, ranging from 11–16 GHz. The gain versus frequency response at different feedback bias currents $I_{fb}$, ranging from 0.5 mA through 3.6 mA is illustrated in FIG. 2. These feedback bias currents correspond to secondary supply voltages $V_{ss}$, ranging from −1 volt through −5 volts, which changes the phase and amplitude characteristics of the HBT active feedback network as well as the bandwidth of the amplifier gain as illustrated in FIG. 3; by increasing the positive feedback to the HEMT.

As shown in FIG. 2, gain peaking occurs when the bias feedback current $I_{fb}$ is approximately 3.6 mA, which corresponds to a secondary supply voltage $V_{ss}$ of −5 volts. When the secondary supply voltage $V_{ss}$ is reduced to about −1 volt corresponding to a feedback current $I_{fb}$=0.5 mA, the gain has a pronounced roll-off. At a secondary supply voltage $V_{ss}$ of −3 volts, which corresponds to a feedback current $I_{fb}$ of 2 mA, the gain has an extended flat response up to about 11 GHz with about a 0.5 dB gain peaking at 13 GHz.

Return loss is a measure of amplitude matching of a node to a normal 50 ohm impedance. The return loss of both the input node, as well as the output node of the LNA in accordance with the present invention, is shown. A return loss of less than 10 dB is considered good. As shown in the lower portion of FIG. 2, the corresponding input and output return loss at a tuning voltage of −3 volts is greater than 10 dB, up to the upper band edge.

Figure 3:
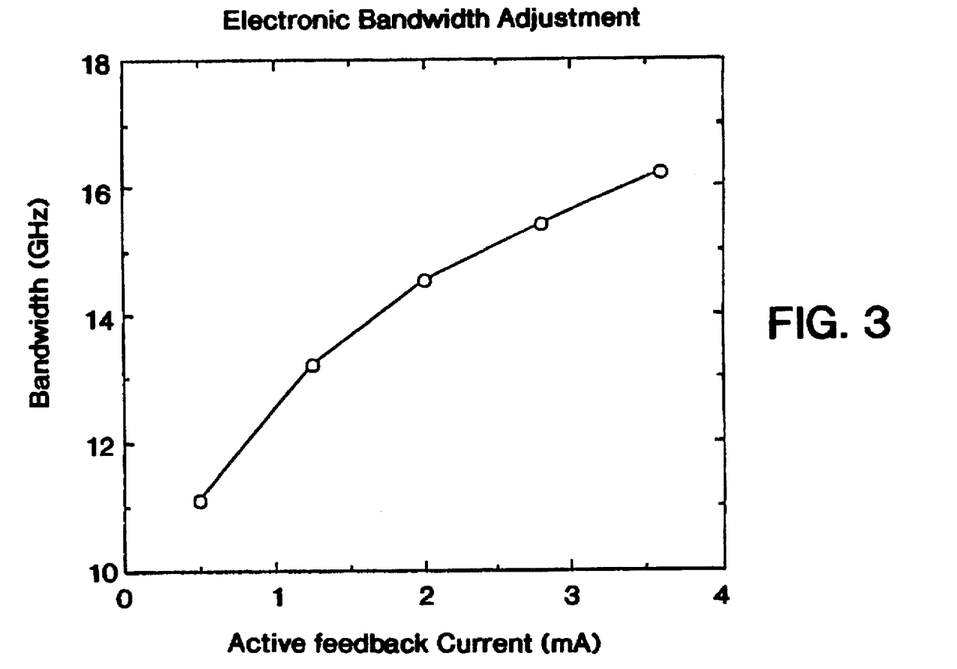
FIG. 3 is a graphical illustration of the bandwidth as a function of active feedback current for the HEMT low noise amplifier in accordance with the present invention.

FIG. 3 illustrates the effect of varying the secondary supply voltage $V_{ss}$ on the bandwidth of the MMIC 20. In particular, as mentioned above, varying the secondary supply voltage $V_{ss}$ varies the feedback bias current $I_{fb}$. FIG. 3 is a graphical illustration of the 3-dB bandwidth as a function of the active feedback current $I_{fb}$. As shown in FIG. 3, by varying the feedback current from about 0.5 mA through 3.6 mA enables the 3-dB bandwidth to be improved from about 11 GHz to 16 GHz, which corresponds to approximately a 50 percent tuning ability for the MMIC 20.

Figure 4:
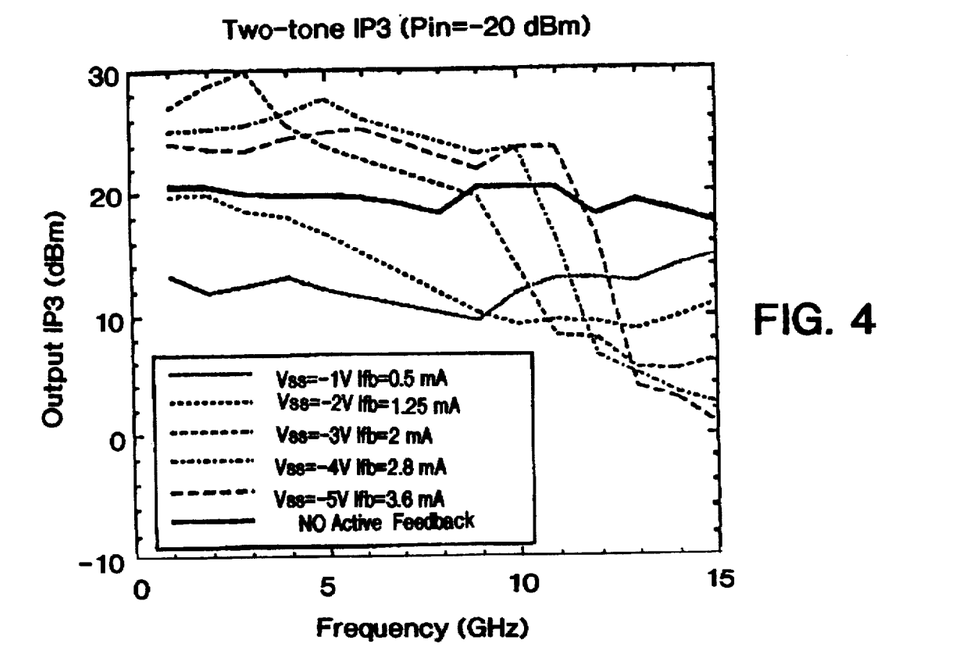
FIG. 4 is a graphical illustration of the two-tone IP3 as a function of frequency for various active feedback bias conditions.

As mentioned above, the linearity of the LNA in accordance with the present invention is also improved without degrading the noise figure performance. One method for determining the linearity performance of an amplifier is by measuring the two-tone third order intercept point (IP3). FIG. 4 illustrates the two-tone third order intercept point (IP3) response as a function of the active feedback bias ($V_{ss}$, $I_{fb}$). For reference, the IP3 response of an equivalent HEMT LNA without active feedback is shown as a bold line; nominally 20 dBm. As shown in FIG. 4, as the active feedback bias current increases, thus inducing positive feedback of the upper band edge, the IP3 intercept point increases at lower frequencies. As the bias is further increased, the performance begins to exceed the conventional HEMT LNA IP3 response (i.e. no active feedback) for frequencies up to about 8 GHz. For example, at a secondary supply voltage $V_{ss}$ −3 volts, and a feedback current $I_{fb}$ of 2 mA, the IP3 intercept is as great as 27–30 dBm, an improvement of about 7–10 dB over the convention HEMT LNA for frequencies from 1–3 GHz. As the bias is further increased, the IP3 performance begins to improve at the higher band edge. For example, at a secondary supply voltage of $V_{ss}$=−5 volts and the feedback bias current $I_{fb}$=3.6 mA, the IP3 is about 24 dBm across the 1–11 GHz band; a 4 dB improvement over the conventional HEMT with no active feedback.

Figure 5:
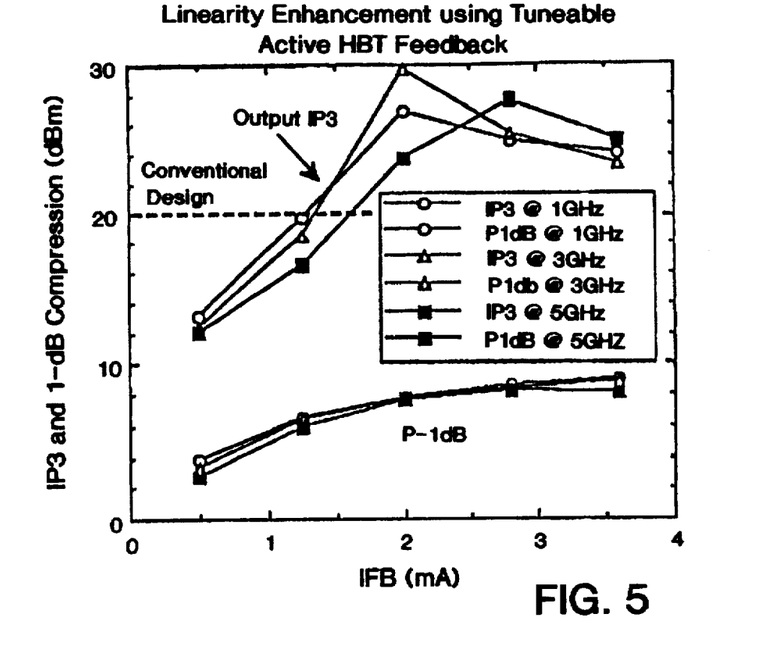
FIG. 5 is a graphical illustration of the output IP3 and 1-dB compression (P-1dB) of the HEMT LNA, in accordance with the present invention, for different active feedback current bias conditions at 1, 3 and 5 gigahertz.

FIG. 5 is a graphical illustration of the output IP3 and 1-dB compression (P-1dB) with varying feedback bias currents $I_{fb}$ at 1, 3 and 5 GHz. As shown in dotted line in FIG. 5, the 20 dBm IP3 level of a conventional HEMT LNA without HBT active feedback is illustrated. Referring to FIG. 5, as the feedback bias current $I_{fb}$ is increased, the 1 dB compression points increase from 3 dBm to 9 dBm. At 1, 3 and 5 GHz the response is nearly identical. As shown, the two-tone intercept response IP3 increases with the feedback bias current up to a maximum intercept point that is about 6–10 dB greater than the conventional level of 20 dBm IP3 for a conventional HEMT LNA without active feedback and then slightly decreases at higher feedback bias currents $I_{fb}$. For a given frequency of 3 GHz, the HEMT LNA MMIC, in accordance with the present invention, provides a 10 dB improvement at a feedback bias current $I_{fb}$=3 mA relative to a conventional HEMT LNA. At higher frequencies, more active feedback bias is required in order to enhance the two-tone intercept point IP3. For example, at 5 GHz, an optimum IP3 point of 26 dBm is achieved at a slightly higher feedback bias current $I_{fb}$=2.8 mA. In a conventional HEMT amplifier, the IP3 point is about 10 dB higher than the P-1dB point. The difference between the IP3 point and the P-1dB compression point can be used to measure the enhanced linearity performance. Since the difference between the IP3 and the P-1dB points in a conventional HEMT amplifier is about 10 dB, a difference greater than 10 dB indicates an improvement in the linearity performance. As shown in FIG. 5, at the optimum feedback bias current $I_{fb}$ for each frequency, the difference between the IP3 and the P1B point is between 17–20 dB, which corresponds to a 7–10 dB improvement in the measure of linearity.

Figure 6:
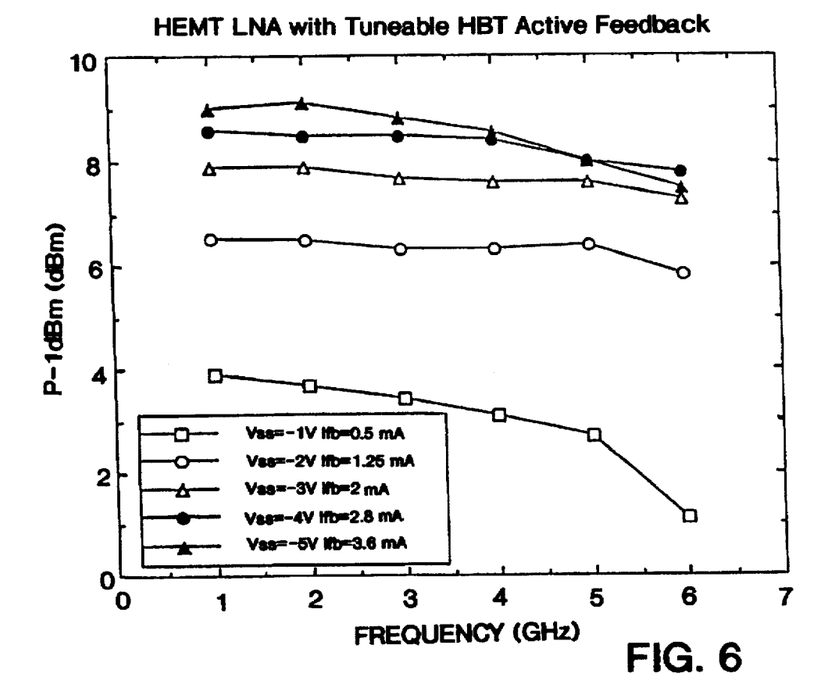
FIG. 6 is a graphical illustration of the P1-dB compression point for the HEMT LNA, in accordance with the present invention, for the different active feedback bias conditions over a frequency range of 1–6 gigahertz.

FIG. 6 is a graphical illustration of the 1-dB compression points over a 1–6 GHz frequency band for different feedback bias points ranging from the secondary supply voltage $V_{ss}$, ranging from −1 volt to −5 volts while the feedback bias currents range from 0.5 mA to 3.6 mA, respectively. The curves in FIG. 6 illustrate that the P-1dB is dependent upon the active feedback bias current $I_{fb}$. At low bias currents, $I_{fb}$, for example 0.5 mA, the active feedback is limiting the P-1dB of the amplifier, the effects of the active feedback on bandwidth performance. At higher bias currents the P-1dB of the amplifier starts to saturate at about 8 dBm and is flat across the band.

The enhanced linearity of the HEMT LNA, due to the active feedback, is frequency dependent as illustrated in FIGS. 4 and 5. Thus, the feedback phase, which is frequency dependent, appears to be correcting for the less-than-ideal 180° out of phase required for negative feedback at a low frequency. At high frequencies a phase in excess of 180° is being induced at a high-feedback bias current $I_{fb}$ to create positive feedback.

Figure 7:
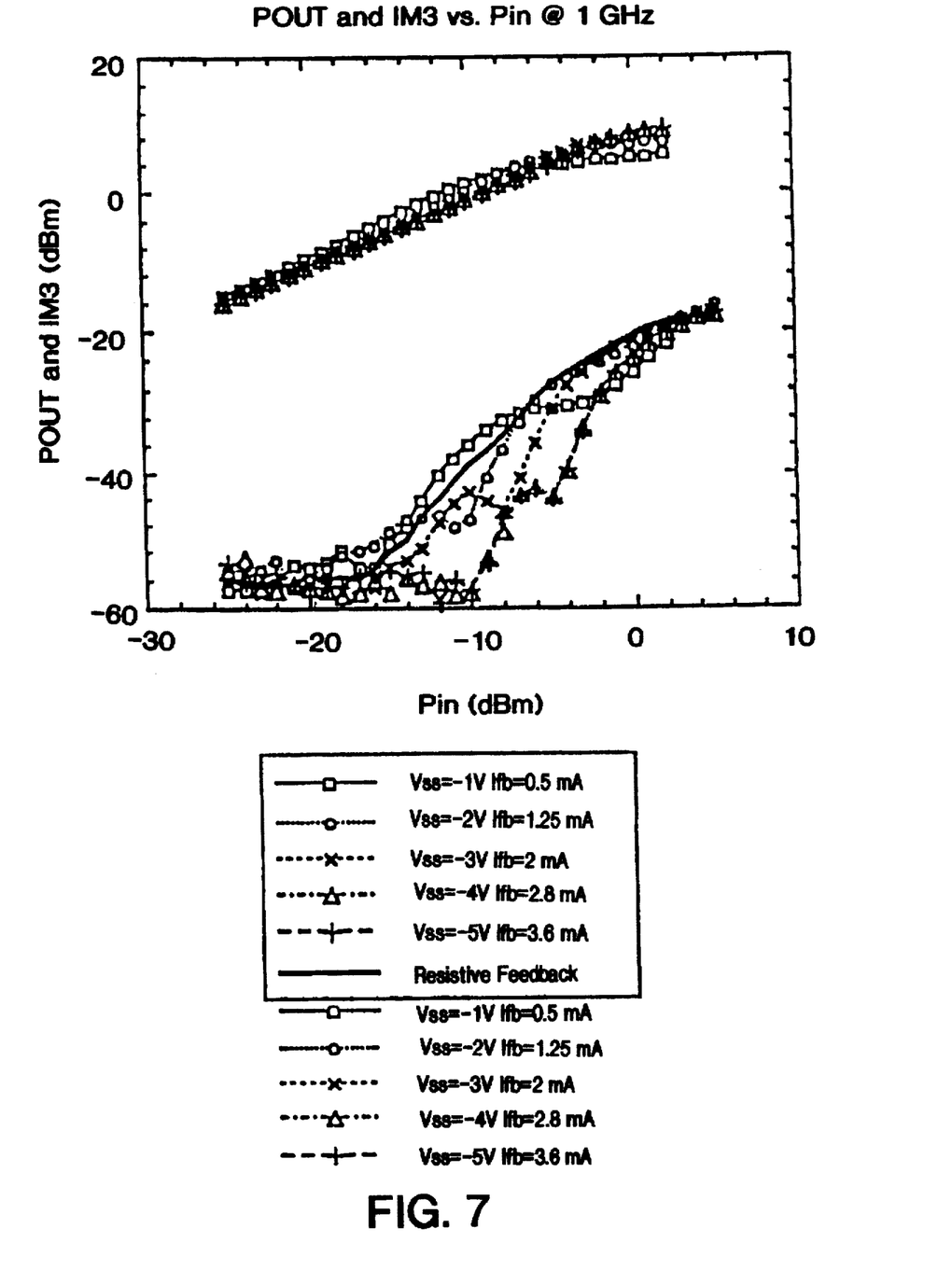
FIG. 7 is a graphical illustration of the fundamental (single-tone) output power (POUT) and third order (two-tone) intermodulation product (IMD) as a function of the input power ($P_{IN}$) at 1 gigahertz.
Figure 8:
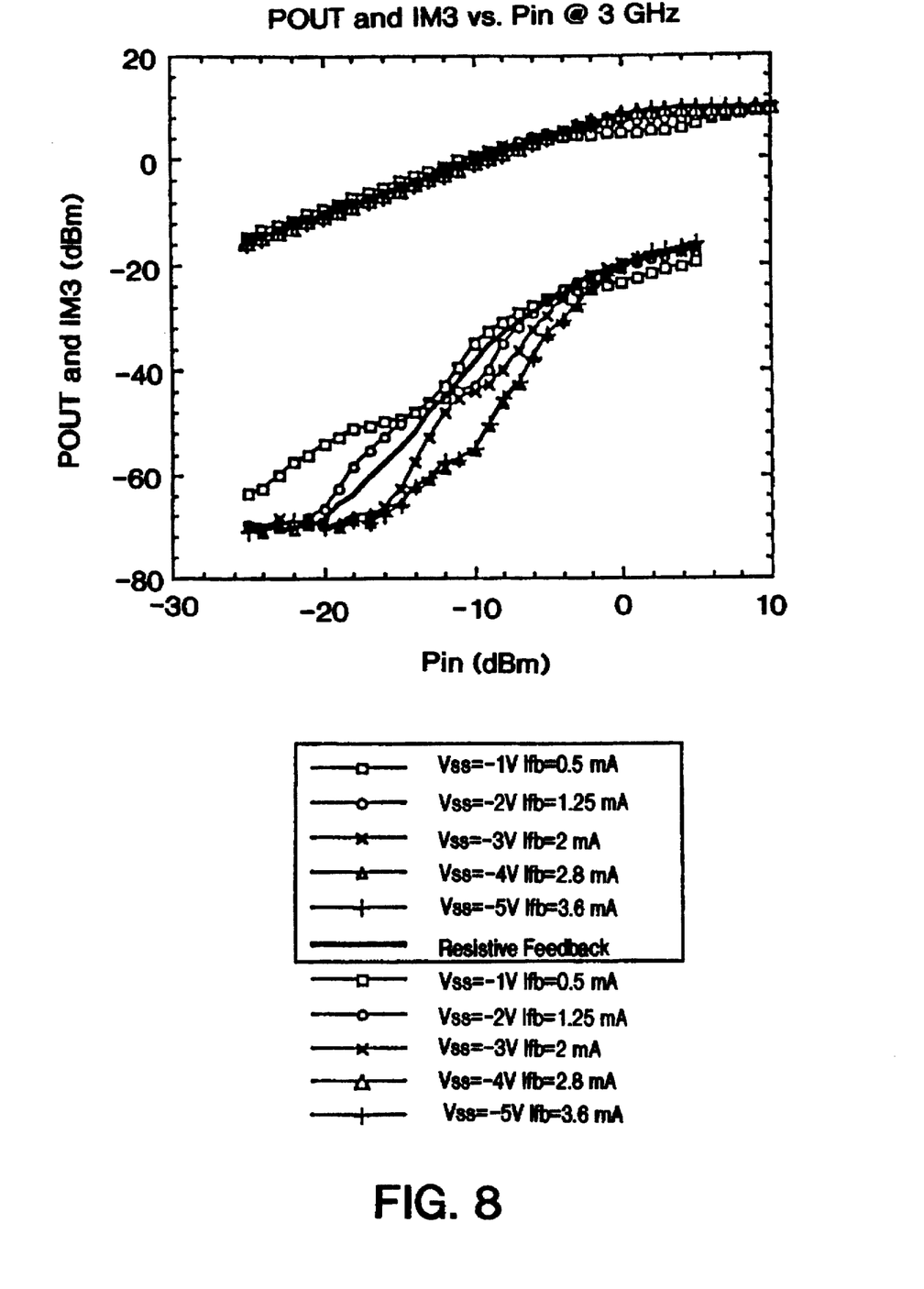
FIG. 8 is a graphical illustration of the fundamental (single-tone) output power (POUT) and third order (two-tone) intermodulation product (IMD) as a function of the input power ($P_{IN}$) at 3 gigahertz.

The linear properties of the LNA, in accordance with the present invention, are further shown in FIGS. 7 and 8, which illustrate the fundamental single-tone output power and third order two-tone intermodulation product (IMD) as a function of input power at 1 and 3 GHz. These plots compare a conventional HEMT LNA (i.e. with conventional resistive feedback) to the HBT tunable active feedback HEMT LNA in accordance with the present invention. At both 1 and 3 GHz, as the HBT active feedback current $I_{fb}$ is increased, the third order intermodulation products become suppressed below the conventional resistive feedback design in the input power range where the amplifier is operating linearly, for example between −20 dBm to 0 dBm. There is about a 19–20 dB improvement in the IMD suppression, at input power of about −10 dBm. At low feedback bias current $I_{fb}$ bias, the IMD performance may be slightly worse than the pure resistive feedback design due to non-linearities generated in the HBT active feedback network. Above an input bias current of about 1.25 mA, the IMD performance begins to significantly improve. However, as the fundamental tone becomes compressed, the IMD product is negligibly lower than the pure resistive feedback design. As such, the IMD performance, as a function of input power requirements, indicate a relatively large improvement in the linearity performance of the HEMT LNA due to the HBT active feedback.

Figure 9:
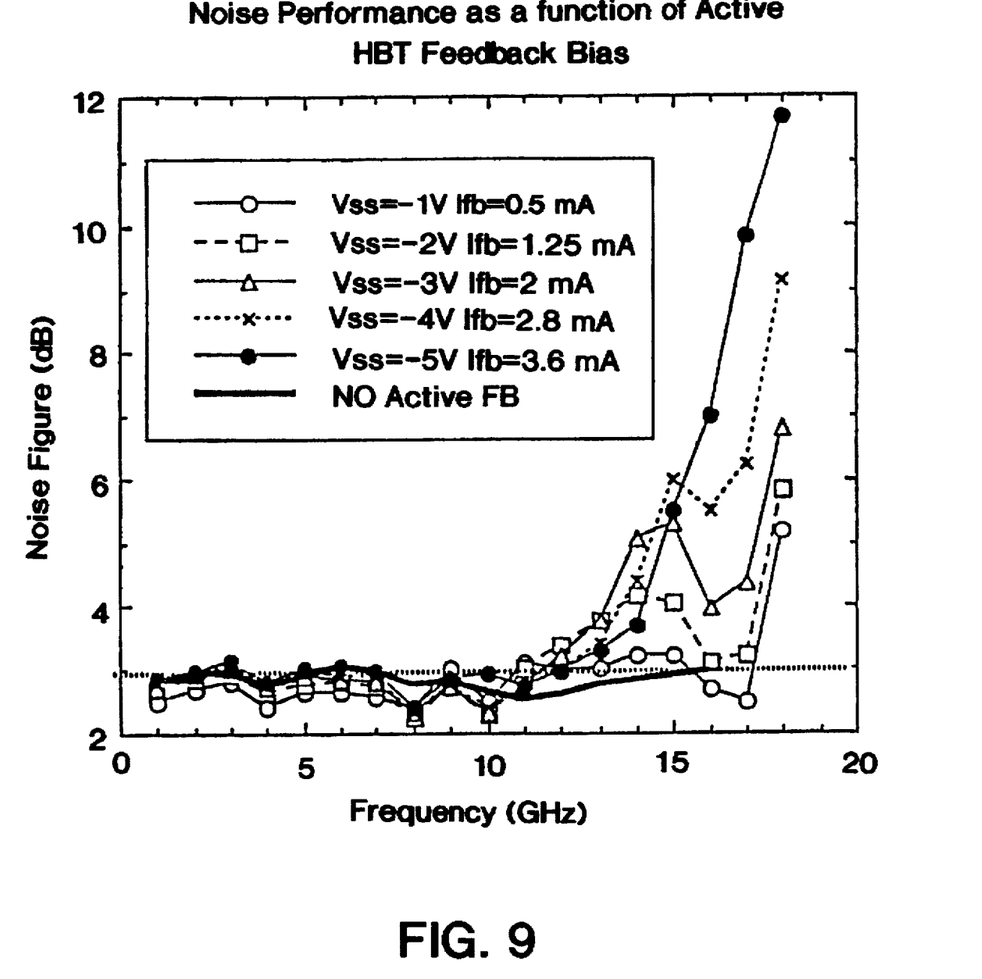
FIG. 9 is a graphical illustration of the noise response at various active feedback bias conditions as a function of the input power $P_{IN}$.

As shown in FIG. 9, the HEMT LNA noise figure performance is relatively insensitive to the tunable HBT active feedback. In particular, the noise response as a function of active feedback bias tuning is illustrated. For reference, a noise response of a conventional HEMT LNA, without active feedback, is shown in a solid line. Referring to FIG. 9, nominal noise response of the HEMT LNA is about 3 dB and is essentially flat from 1–11 GHz. As such, it is clear that the noise response is not sensitive to the active feedback bias and is comparable to the conventional HEMT LNA design in the 1–11 GHz frequency band. Above about 11 GHz, gain begins to peak for increase in active feedback bias and the noise performance begins to abruptly degrade, which illustrates the effect of positive feedback, which regenerates the noise amplitude along with the signal, resulting in gain peaking and noise figure degradation. However, such noise performance degradation only occurs above the 1–11 GHz range where a desired flat gain response is attained.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A monolithic microwave integrated circuit (MMIC) comprising:

a high-electron mobility transistor (HEMT) having gate, source and drain terminals;

an active feedback circuit, electrically coupled between said gate terminal and said drain terminal, said active feedback circuit including one or more heterojunction bipolar transistors (HBTs);

means for self-biasing said HEMT;

means for enabling the gain-bandwidth and linearity performance of said MMIC to be adjusted externally from said MMIC, wherein said enabling means includes means for receiving a first DC supply voltage and a second DC supply voltage, one of said first and second DC supply voltages being adjustable.

2. An MMIC as recited in claim 1, wherein said active feedback circuit includes resistive feedback, electrically coupled to said HBTs.

3. An MMIC as recited in claim 1, wherein said active feedback circuit includes two HBTs connected in cascode, defining first and second base terminals, a first emitter terminal and a first collector terminal, electrically coupled between said gate and drain terminals of said HEMT.

4. An MMIC as recited in claim 3, wherein said active feedback circuit includes a feedback resistor electrically coupled between said first emitter terminal of said cascode connected HBTs and said gate terminal of said HEMT.

5. An MMIC as recited in claim 4, wherein said self-biasing means includes a load resistor, electrically coupled between said drain terminal of said HEMT and said cascode-connected HBTs.

6. An MMIC as recited in claim 5, wherein said active feedback circuit includes a feedback tuning resistor, electrically coupled between said first base terminal of said cascode-connected HBTs and said drain terminal of said HEMT.

7. An MMIC as recited in claim 6, wherein said self-biasing means includes a DC bias resistor, electrically coupled between said second base terminal and said second collector terminal of said cascode-connected HBTs.

8. An MMIC as recited in claim 7, wherein said active feedback circuit includes a bypass capacitor, electrically coupled between said DC bias resistor and ground.

9. A monolithic microwave integrated circuit (MMIC) comprising:

a high-electron mobility transistor (HEMT) having a gate, drain and source terminals;

an active feedback circuit electrically coupled between said gate and drain terminal, said active feedback circuit including one or more heterojunction bipolar transistors (HBTs);

means for enabling the feedback of said active feedback circuit to be adjusted external to said MMIC, wherein said enabling means includes means for receiving a source of DC voltage, said source of DC voltage being adjustable.

* * * * *